United States Patent
Street et al.

(10) Patent No.: US 7,888,965 B2
(45) Date of Patent: Feb. 15, 2011

(54) DEFINING A DEFAULT CONFIGURATION FOR CONFIGURABLE CIRCUITRY IN AN INTEGRATED CIRCUIT

(75) Inventors: David Ray Street, Allen, TX (US); Degang Xia, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 12/362,128

(22) Filed: Jan. 29, 2009

(65) Prior Publication Data
US 2010/0188117 A1 Jul. 29, 2010

(51) Int. Cl.
H03K 19/173 (2006.01)
G11C 5/14 (2006.01)
H02M 1/10 (2006.01)

(52) U.S. Cl. .......................... 326/38; 326/37; 327/530; 327/538; 327/547

(58) Field of Classification Search ............. 326/37–38; 327/530, 538, 547
See application file for complete search history.

(56) References Cited

U.S. PATENT DOCUMENTS

| | | | | |
|---|---|---|---|---|
| 4,940,909 A * | 7/1990 | Mulder et al. | ................. | 326/38 |
| 5,051,622 A * | 9/1991 | Pleva | ......................... | 326/38 |
| 6,043,677 A * | 3/2000 | Albu et al. | ..................... | 326/39 |
| 6,157,207 A * | 12/2000 | Eaton et al. | .................... | 326/38 |
| 6,262,594 B1 * | 7/2001 | Cheung et al. | ................ | 326/38 |
| 6,466,048 B1 * | 10/2002 | Goodman | ....................... | 326/8 |
| 6,538,468 B1 * | 3/2003 | Moore | .......................... | 326/40 |
| 6,664,803 B2 * | 12/2003 | Goodman | ....................... | 326/8 |
| 6,784,704 B2 * | 8/2004 | Sato | ........................... | 327/143 |
| 7,019,558 B1 * | 3/2006 | Jacobson et al. | ............. | 326/38 |
| 7,020,764 B2 * | 3/2006 | Kubota et al. | ................ | 712/37 |
| 7,030,646 B1 * | 4/2006 | Tyson | ........................ | 326/38 |
| 7,154,297 B1 * | 12/2006 | Camarota et al. | ............ | 326/40 |
| 7,242,218 B2 * | 7/2007 | Camarota et al. | ............ | 326/41 |
| 7,282,949 B2 * | 10/2007 | Goodnow et al. | ............ | 326/38 |
| 7,304,493 B2 * | 12/2007 | Goodnow et al. | ............ | 326/16 |
| 7,489,163 B2 * | 2/2009 | Goodnow et al. | ............ | 326/38 |
| 7,498,837 B1 * | 3/2009 | Tyson | ........................ | 326/38 |
| 7,512,849 B1 * | 3/2009 | Allen et al. | .................. | 714/725 |
| 7,550,994 B1 * | 6/2009 | Camarota et al. | ............ | 326/38 |
| 2003/0020512 A1 * | 1/2003 | Mantey et al. | ................ | 326/38 |
| 2003/0122577 A1 * | 7/2003 | Veenstra et al. | ............... | 326/38 |
| 2003/0179010 A1 * | 9/2003 | Gerstmeier et al. | .......... | 326/37 |
| 2006/0119384 A1 * | 6/2006 | Camarota et al. | ............ | 326/38 |

\* cited by examiner

*Primary Examiner*—James H. Cho
*Assistant Examiner*—Matthew C Tabler
(74) *Attorney, Agent, or Firm*—Dawn V. Stephens; Wade James Brady, III; Frederick J. Telecky, Jr.

(57) ABSTRACT

An integrated circuit with a configurable portion, such as an input/output port, that can be placed in a default configuration prior to actual configuration of the integrated circuit. An external terminal that serves as an output during normal operation is coupled, after power-on of the integrated circuit, to a comparator that senses the voltage level at that external terminal. If the external terminal is at a particular level, a multiplexer is controlled to ignore the state of the normal configuration memory, and to place the configurable input/output port into a default protocol.

16 Claims, 4 Drawing Sheets

DEFINING A DEFAULT CONFIGURATION FOR CONFIGURABLE CIRCUITRY IN AN INTEGRATED CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to the configuration of input/output circuits for purposes of test.

Some modern integrated circuits include functions that are configurable during or after manufacture. Typically, the configuration is defined in a non-volatile manner, so that the desired configuration is retained after power-down of the circuit. Various technologies are available for implementation of the non-volatile configuration information, including fusible links, laser-trimmable elements, and electrically erasable programmable read-only memory (EEPROM) cells. EEPROM technology has become the technology of choice for non-volatile storage of such configuration information, because of the ability to re-program that information if desired. Typically, the integrated circuit is configured by the manufacturer after the device has successfully completed functional and parametric testing. In some cases, configurability is also made available to the system user of the integrated circuit.

One example of configurable circuitry in conventional integrated circuits is logic or other functionality that selects the manner in which input and output circuitry operates. More specifically, the input/output functionality may be constructed to be operable according to a selected one of multiple protocols, each protocol conforming to the custom input/output port specifications of a particular customer or user of the device. Configurability of the selection of the protocol allows the manufacturer to produce a large quantity of the integrated circuits without regard to current demand of individual customers, and to configure the devices for a particular customer on demand.

FIG. 1a illustrates an example of an integrated circuit 2 having a configurable synchronous input/output port 6. Integrated circuit 2 includes functional circuitry 4, which performs the primary function of integrated circuit 2. Input/output port 6 is in communication with functional circuitry 4, and in the conventional manner, receives external input signals and data for processing by functional circuitry 4, and presents the results of that processing as output signals. Input/output port 6 can have various attributes. For example, input/output port 6 can be either a serial port or parallel port, can be either synchronous (receiving and presenting clocked signals) or asynchronous (receiving and presenting unclocked signals), and can communicate either via dedicated input and output terminals or via common input/output terminals (i.e., the same pins or terminals used for input and output). EEPROM 8 is provided within integrated circuit 2 to store data values that "trim" various operating parameters, for example by presenting levels on lines TRIM1, TRIM2 that adjust the output of current reference generator circuit 7 and bandgap reference circuit 9, respectively.

For the particular example of FIG. 1a, input/output port 6 is controlled in response to signals presented at enable pin EN, which is an input to port 6 that is asserted upon an external device wishing to enable the transfer of data to or from integrated circuit 2 via data pin or pins DATA. In one example, in which input/output port 6 is a serial port, the direction of the data transfer is determined by the contents of the data presented at a single data pin DATA; for example, a particular register within integrated circuit 2 may be specified by the first n bits applied to data pin DATA, with the next $(n+1)^{th}$ bit) indicating the direction of transfer. Other approaches to control of the direction of data transfer are known in the art and may alternatively be implemented.

In this conventional integrated circuit 2, input/output port 6 can be configured according to a selected one of multiple protocols, by way of one or more programmed bits in EEPROM 8. Examples of alternative protocols available to port 6 are illustrated in FIGS. 1b and 1c. According to the protocol shown in FIG. 1b, input/output port 6 is enabled by a device external to integrated circuit 2 asserting a low level at terminal EN, followed by presenting a sequence of logic levels at terminals DATA synchronously with rising edges of a periodic clock signal at terminal CLK. The protocol shown in FIG. 1c is similar to that shown in FIG. 1b, in that an external device presents data signals on terminals DATA synchronously with rising edges of a clock signal at terminal CLK. However, in the protocol shown in FIG. 1c, the enable signal at terminal EN is active at a high logic level, rather than at a low logic level as shown in FIG. 1b. As noted above, the direction of eventual data transfer in this example is indicated by the state of a particular bit within the sequence applied to terminal or terminals DATA. The protocol according to which input/output port 6 operates is determined in response to the state of a bit within EEPROM 8. With that bit programmed in one state, input/output port 6 is configured to respond to enable signal EN at a logic low level (FIG. 1b), and in response to that bit being programmed in the opposite state, input/output port 6 is configured to respond to enable signal EN at a logic high level. In this conventional approach, the manufacturer (or possibly the user) programs that configuration bit within EEPROM 8 to select the desired protocol.

However, it is important for the manufacturer to fully test integrated circuit 2, either in wafer form or after packaging (or both), before the selection of the protocol according to which input/output port 6 will operate. In other words, in the example of FIGS. 1a through 1c, after manufacture and before configuration, the cells of EEPROM 8 can be in an indeterminate state. One cannot reliably assume the initial configuration of input/output port 6 as a result, which prevents accurate testing or characterization of integrated circuit 2.

In conventional integrated circuits, this problem is resolved by providing an external terminal by way of which the manufacturer or user, as the case may be, cam externally define the operation of the device. In the example of integrated circuit 2 of FIG. 1a, terminal TEST_CONFIG is coupled to input/output port 6. A logic level or other signal applied to terminal TEST_CONFIG defines the operating protocol of input/output port 6. Once configured by the application of this external signal, integrated circuit 2 can then be fully tested, both parametrically and functionally.

However, a separate dedicated external pin or terminal for this purpose adds substantial cost. Chip area of the integrated circuit is required for the terminal and the associated circuitry and conductor paths, even if this dedicated terminal is used only for wafer-level test. However, because small-scale integrated circuit devices may not be tested in wafer form but are instead electrically tested only after packaging, this approach requires an external package terminal to be dedicated to this test configuration function. Unfortunately, device "pin count" is a significant constraint for many integrated circuits, especially for small scale integrated circuits that the customer expects to be in a low pin count package. In addition, if an external package pin is required, the customer is typically required to bias that pin to a specified level to ensure that normal operation of the device is not disrupted, which necessitates circuit board space for routing that voltage to the dedicated external pin. From a market standpoint, it is difficult to pass this cost on to the customer for the manufacturer's benefit.

BRIEF SUMMARY OF THE INVENTION

This invention provides an integrated circuit and method of operating an integrated circuit, by way of which a default state of a configurable circuit function can be defined and set prior to configuration of the function.

This invention also provides such a circuit and method in which the configurable circuit function is an input/output port.

This invention also provides such a circuit and method in which an external terminal that is also used in normal circuit operation is used to define the default state of the configurable circuit function.

This invention also provides such a circuit and method in which the setting of the default state is transparent to the system user of the integrated circuit.

Other advantages of this invention will be apparent to those of ordinary skill in the art having reference to the following specification together with its drawings.

This invention may be implemented into an integrated circuit that has a configurable circuit function, for example an input/output port. On power-up, circuitry senses the level driven at an external terminal that otherwise serves as an output during normal functional operation. In response to that externally driven level being at a selected state, the configurable circuit function is placed in a default condition; otherwise the configurable circuit function is placed in a state corresponding to its normal configuration setting.

DETAILED DESCRIPTION OF THE INVENTION

The invention will be described in connection with its embodiments. It will be readily apparent from this description, to those skilled in the art, that this invention can be implemented into a wide range of integrated circuits capable of performing a wide variety of circuit functions. Accordingly, it is to be understood that the following description is provided by way of example only, and is not intended to limit the true scope of this invention as claimed.

Figure 2:
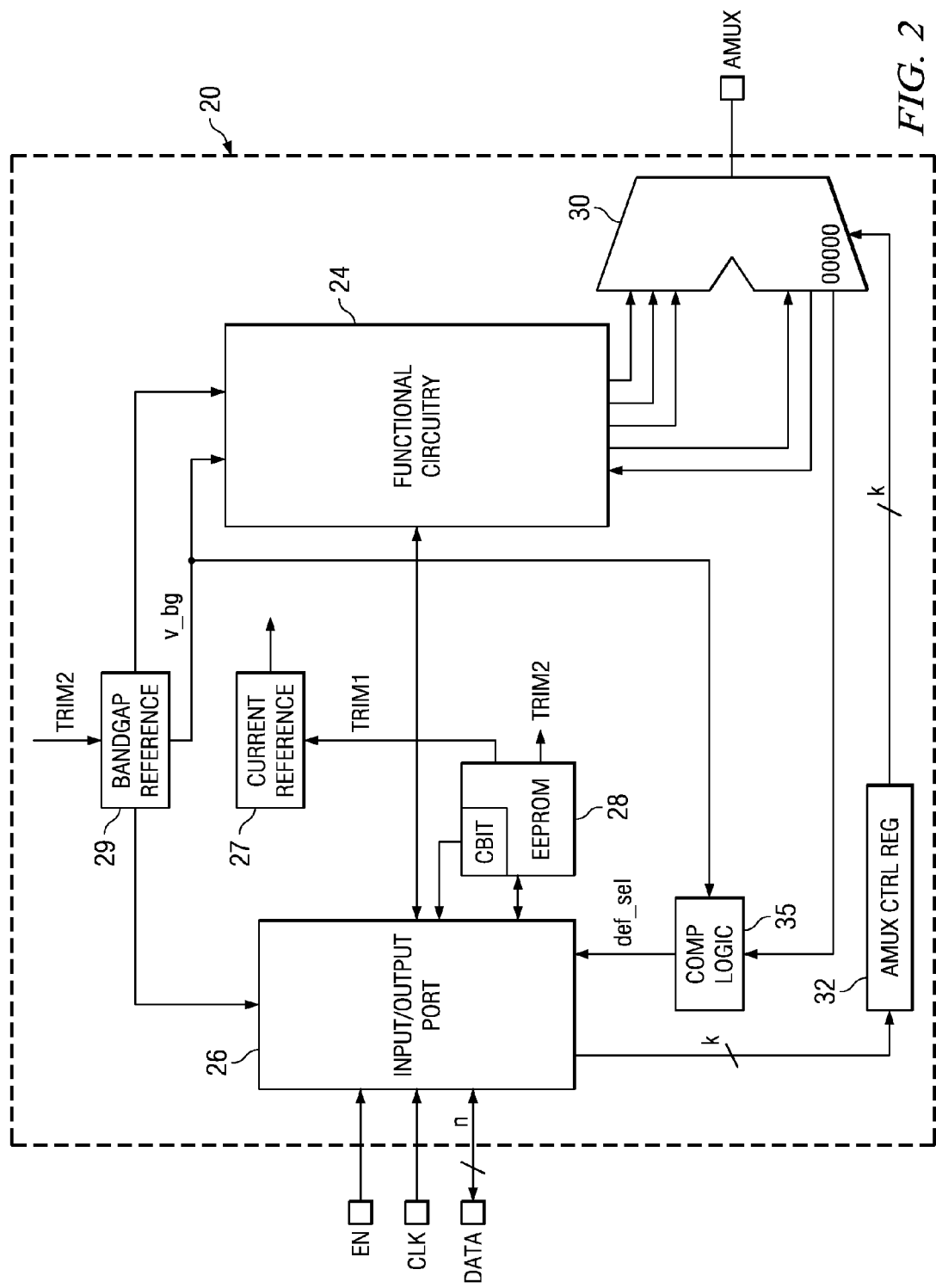
FIG. 2 is an electrical diagram, in block form, of an integrated circuit constructed according to an embodiment of the invention.

FIG. 2 illustrates an example of an embodiment of this invention, as implemented into integrated circuit 20. Integrated circuit 20 is designed to carry out a desired function by way of its functional circuitry 24. The particular function performed by integrated circuit 20 is not of particular relevance in connection with this invention, and as such functional circuitry 24 may represent analog circuitry, digital logic or memory circuitry, programmable logic circuitry, communications circuitry, any other type of functional circuitry, or combinations thereof. In addition, the particular technology according to which integrated circuit 20 is manufactured is not of particular relevance to this invention, and as such the active devices in integrated circuit 20 may be implemented as metal-oxide-semiconductor (MOS) transistors, bipolar transistors, or a combination of bipolar and MOS devices. The description of integrated circuit 20 in this specification, as including circuit elements constructed of MOS transistors, is therefore presented by way of example only.

According to this invention, at least one circuit function within integrated circuit 20 is configurable by the manufacturer, or perhaps by the user, of integrated circuit 20. In the example of FIG. 2, this configurable function is shown by configurable input/output port 26. It is contemplated that the configurable circuit function of this invention is not necessarily an input or output function, but rather may correspond to a functional circuit or a control circuit within integrated circuit. It is contemplated that those skilled in the art having reference to this specification will readily recognize the applicability of this invention to those alternative configurable circuit functions.

Referring to FIG. 2, the particular form and structure of input/output port 26 is not of particular relevance to this invention. For example, input/output port 26 may be either a parallel I/O port, or a serial I/O port. As known in the art, serial port 26 would generally utilize a single terminal DATA (n=1), while a parallel port 26 would provide multiple terminals DATA (n>1). In this embodiment of the invention, input/output port 26 is a synchronous input/output port, and as such receives clock signals at terminal CLK, such clock signals synchronizing valid data at terminals DATA, in either direction (input or output), according to conventional techniques. Alternatively, input/output port 26 may be constructed to receive and present data levels asynchronously. Input/output port 26 may have separate dedicated input and output terminals DATA, if desired. However, according to this particular embodiment of the invention, the number of external terminals of integrated circuit 20 is preferably minimized. As such, terminals DATA in this example serve both input and output functions. In one example in which input/output port 26 is a serial port, the direction of data transfer is controlled by the content of signals applied to single serial I/O terminal DATA. For example, the first m bits applied to terminal DATA, following enabling of input/output port 26 by an active level at terminal EN, serve as a register address to which data will be written or from which data will be read. The next (m+1$^{th}$) bit applied to terminal DATA then indicates the direction of transfer (e.g., "1" indicates a read, and "0" indicates a write).

Figure 1A:
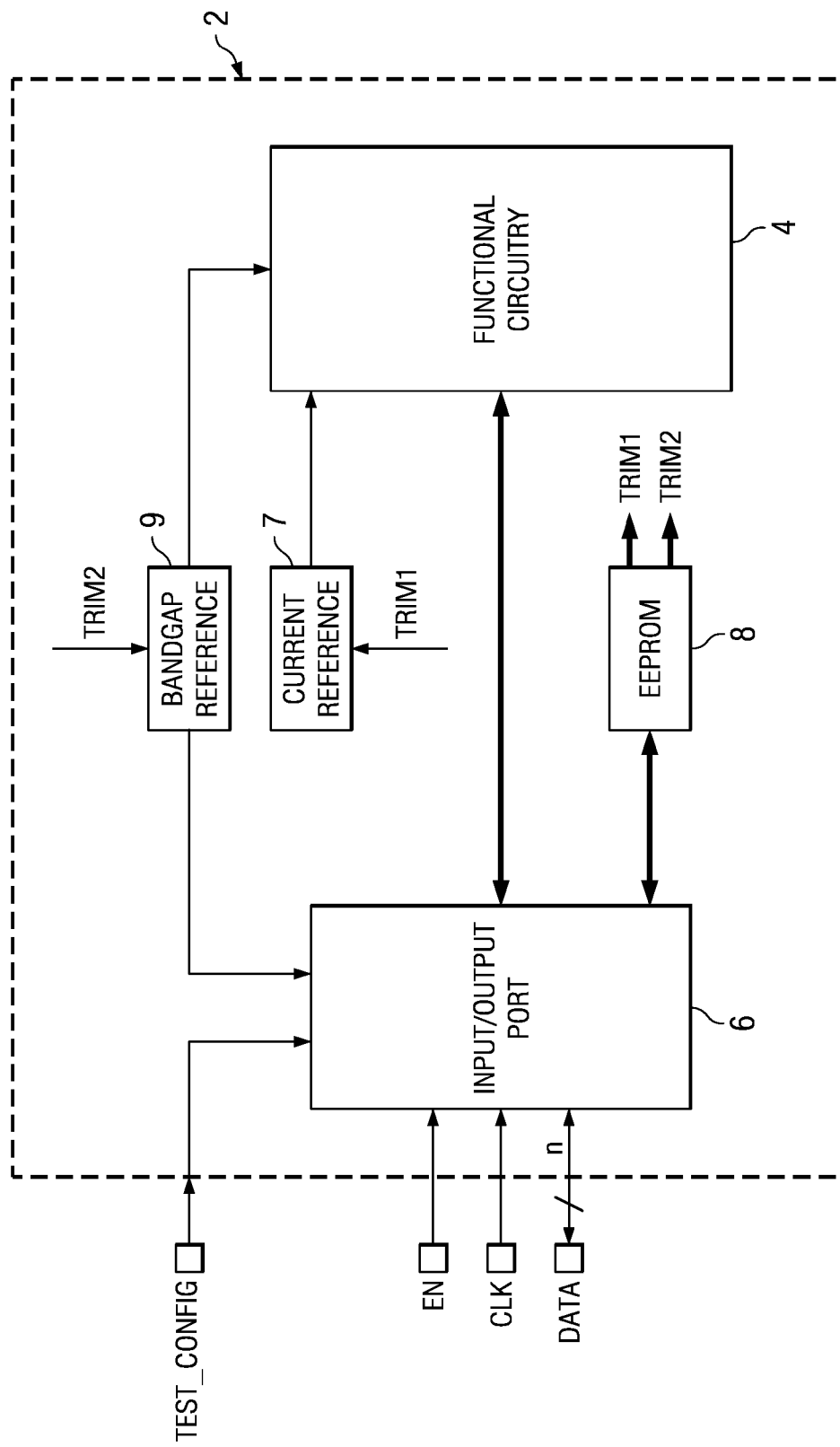
FIG. 1a is an electrical diagram, in block form, of a conventional integrated circuit including a configurable input/output port.
Figure 1B:
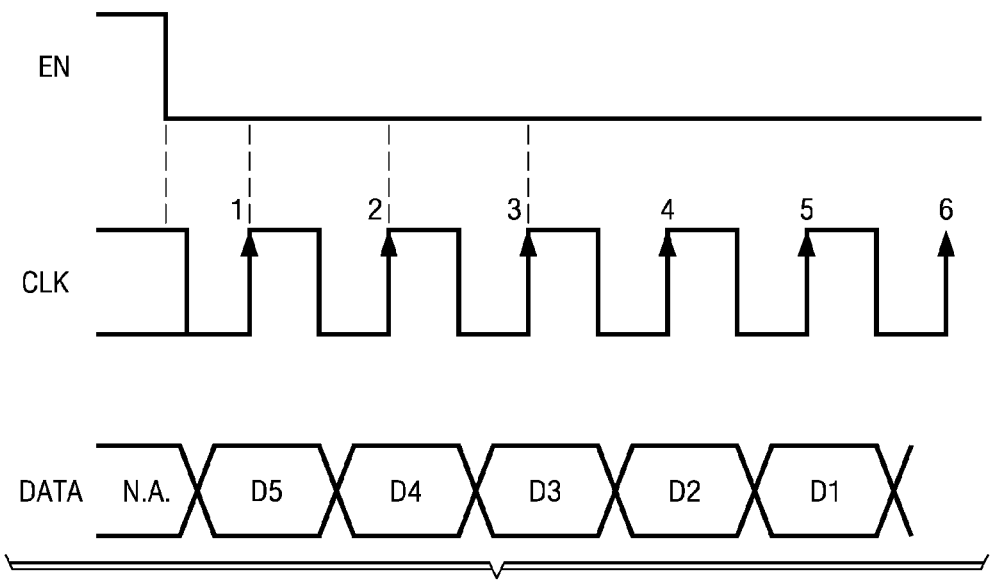
FIGS. 1b and 1c are timing diagrams illustrating the operation of conventional available protocols into which the input/output port of the integrated circuit of FIG. 1a may be placed.
Figure 1C:
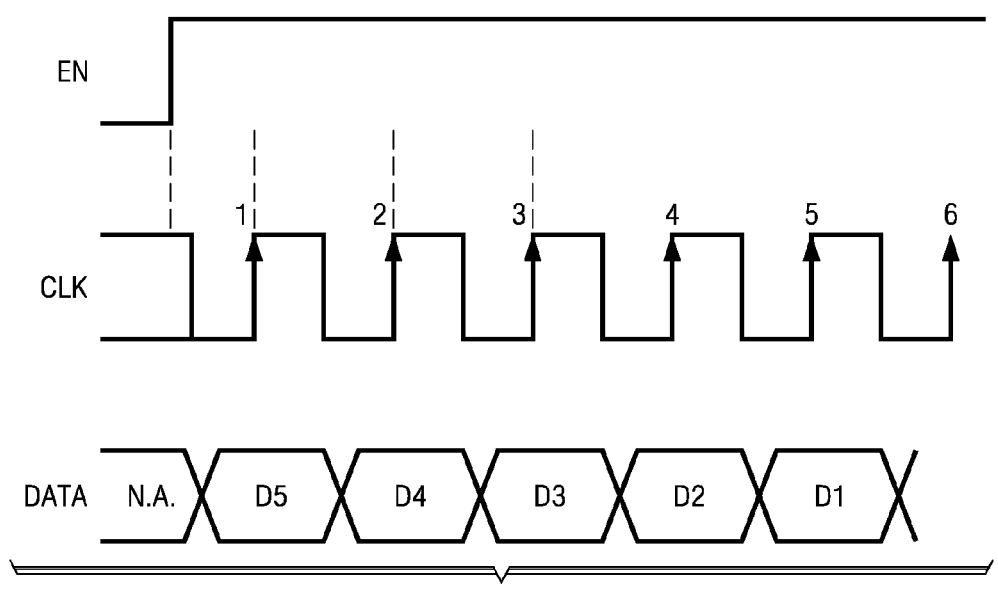

In the example of FIG. 2, the input/output protocol under which input/output port 26 is operating specifies the appropriate logic level at terminal EN that will enable input/output port 26. According to this embodiment of the invention, multiple input/output protocols are available, and can be configured by the manufacturer of integrated circuit 20. Examples of alternative protocol choices, according to which input/output port 26 can function, are shown in FIGS. 1b and 1c described above, for the case of input/output port 26 constructed as a serial port. As described above, those alternative protocols specify different active logic levels applied to terminal EN to enable input/output port 26. In this example, these logic levels are mutually exclusive with one another. Other differences in protocol, including the manner of operation of input/output port 26, the assignment of various terminals to particular functions, and the like may alternatively or additionally defined by the configuration of port 26.

In this embodiment of the invention, the configuration of input/output port 26 is defined by one or more bits within electrically eraseable programmable read-only memory (EEPROM) 28. For the example of the alternative protocols of FIGS. 1b and 1c, a single bit CBIT within EEPROM 28 will suffice; if additional protocol choices are available, of course additional configuration bits will be required within EEPROM 28. EEPROM 28 can also be programmed to select other parameters within integrated circuit 20, such as the "trim" levels TRIM1, TRIM2 that are forwarded by EEPROM28 to current reference circuit 27 and bandgap reference circuit 29, respectively, in the example of FIG. 2. According to this embodiment of the invention, the manufacturer of integrated circuit 20 is able to program these and other configuration, trim, and select values within EEPROM 28, for example after electrical evaluation of integrated circuit 20 to determine the trim values to be used. It is contemplated that integrated circuit 20 may alternatively be arranged so that the user can program EEPROM 28 in whole or in part, even after the packaging and previous configuration performed by the manufacturer. Further in the alternative, other technologies such as fusible links (laser or electrical) and the like may be used in place of EEPROM 28 to set the configuration, trim levels, and other programmable features within integrated circuit 20.

Other circuit functions may also be included within integrated circuit 20, but are not shown in FIG. 2 for the sake of clarity. Examples of these other circuit functions include power management circuitry, voltage regulators, clock generation circuitry, and the like. In addition, other input and output terminals outside of input/output port 26 may be provided, depending on the desired functionality of integrated circuit 20.

According to this embodiment of the invention, circuitry is provided within integrated circuit 20 that allows an externally-applied signal to define a "default" configuration for its configurable circuitry, prior to the actual configuration of that configurable circuitry. This defining of a default configuration enables integrated circuit 20 to be operated for purposes of electrical and functional test and characterization, and for other purposes, avoiding the indeterminate condition that can otherwise be present if integrated circuit 20 is simply operated prior to configuration. In this example, the states of memory cells within EEPROM 28 are indeterminate after manufacture and prior to programming (or erasure), and cannot be relied on to be in either a programmed or erased state. That indeterminate state precludes a user of integrated circuit 20 from reliably operating the device after manufacture and prior to configuration, and any results obtained from integrated circuit 20 in this indeterminate state would not fairly indicate the actual characteristics of the device once properly configured.

According to this embodiment of the invention, this circuitry for pre-configuration definition of a default configuration mode uses one or more existing external terminals that are otherwise available in its normal operation. This eliminates the need to enlarge the "pin count" of integrated circuit 20 simply for this test purpose. In the example of FIG. 2, integrated circuit 20 includes multiplexer 30, which is a conventional multiplexer capable of routing the state of a selected internal signal to external terminal AMUX. As shown in FIG. 2, many of the inputs to multiplexer 30 are driven by functional circuitry 24; one or more of these inputs to multiplexer 30 may alternatively couple nodes in other circuitry within integrated circuit 20 to terminal AMUX. The select input of multiplexer 30 is driven from AMUX control register 32, which in this example is a register that is writable by external data signals applied to and read by input/output port 26 (after port 26 has been configured to its selected protocol, of course). The internal signal selected by multiplexer 30 for connection to external terminal AMUX may constitute a control signal in normal operation; alternatively, external terminal AMUX may be used only during test or other evaluation of integrated circuit 20, and have no function during normal operation. In addition, as suggested by FIG. 2, multiplexer 30 may be operable to receive an external level at terminal AMUX and forward that level as an input to functional circuitry 24. Such an operation may be useful in measuring a threshold or "trip" level for a comparator within functional circuitry 24, for example by varying the voltage applied to terminal AMUX while monitoring the functional operation of integrated circuit 20.

According to this embodiment of the invention, multiplexer 30 is capable of forwarding the state of terminal AMUX to comparator logic 35, as shown in FIG. 2. A reference or threshold voltage, for example bandgap reference voltage v_bg generated by bandgap voltage reference circuit 29, is also forward to an input of comparator logic 35. Based on the results of a comparison performed by comparator logic 35, as will be described below, comparator logic 35 forwards a control signal to input/output port 26 via line def_sel. And as will also be described in further detail below, the logic level of that line def_sel will assist in the definition of a default configuration of input/output port 26, without relying on the state of bit CBIT in EEPROM 28.

In the example of FIG. 2, the output of multiplexer 30 selects the line connected to comparator logic 35 in response to its select input being at a specific state. For example, if thirty-two input lines are received by multiplexer 30, a five-bit select signal (k=5) must be presented by AMUX control register 32 to select among those thirty-two lines. According to this embodiment of the invention, AMUX control register 32 is constructed so that it loads a default select value (e.g., $00000_2$) upon reset or power-up of integrated circuit 20. This default select value $00000_2$ is forwarded to the select input of multiplexer 30, causing it to couple terminal AMUX to the input that is connected to comparator logic 35.

Figure 3:
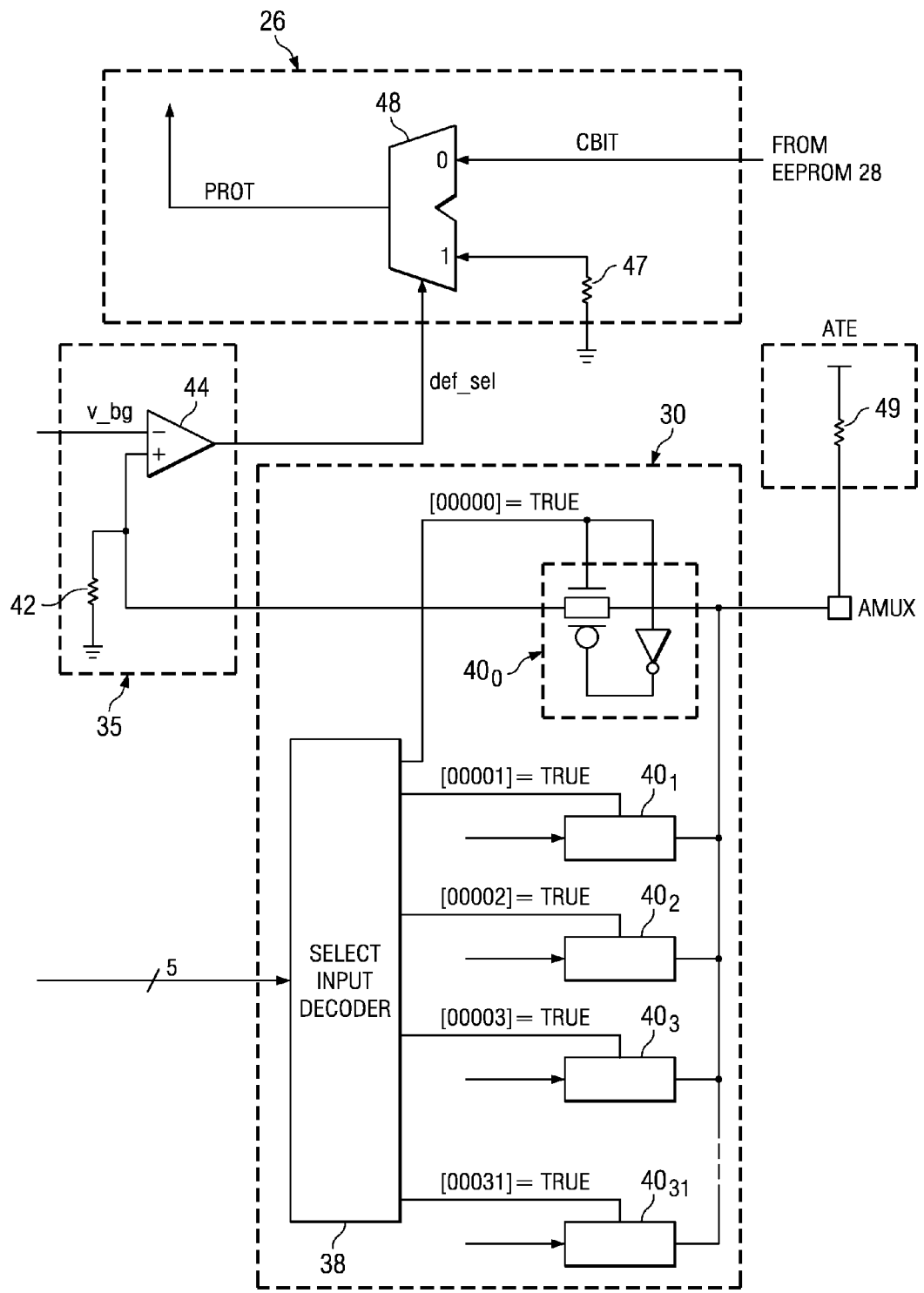
FIG. 3 is an electrical diagram, in block and schematic form, of circuitry in the integrated circuit of FIG. 2, by way of which a default configuration can be selected.

The construction of a portion of multiplexer 30, comparator logic 35, and a portion of input/output port 26, as involved in the defining of a default configuration state upon power-up, is illustrated in further detail in FIG. 3. Multiplexer 30 is constructed in the conventional fashion, by way of a set of pass gates $40_0$ through $40_{31}$, each connecting a corresponding multiplexer input to its output at terminal AMUX. As shown in additional detail for pass gate $40_0$ by way of example, each pass gate 40 can be constructed as a pair of complementary MOS transistors (p-channel and n-channel MOS) with their source-drain paths connected in parallel, and receiving complementary versions of the same control signal from select input decoder 38 so that both transistors are on and off at the same time. Select input decoder 38 receives the select signal from AMUX control register 32, that signal consisting of a live-bit digital value in this example in which multiplexer 30 selects from among up to thirty-two inputs for connection to terminal AMUX. In the example of FIG. 3, pass gate $40_0$ is made conductive responsive to select input decoder 38 driving line "[00000]=true" to an active high level responsive to receiving the digital value $00000_2$ at its input from AMUX control register 32. Similarly, select input decoder 38 drives similar lines "[00001]=true" etc., to turn on pass gates $40_1$ etc., respectively, in response to a matching digital value received from AMUX control register 32.

Comparator logic circuitry 35, in this embodiment of the invention, includes comparator 44. Comparator logic circuitry 35 receives the multiplexer input corresponding to pass gate $40_0$ at its positive input, and receives a reference voltage, such as bandgap reference voltage v_bg from bandgap reference circuit 27, at its negative input. The positive input of comparator 44 is also coupled to ground via pull-down resistor 42. The output of comparator 44, which is at a logic level corresponding to whether the voltage at its positive input exceeds that at its negative input, is communicated to input/output port 26 on control line def_sel. This control line def_sel is connected to the select input of multiplexer 48 within input/output port 26. The input to multiplexer 48 that is selected in response to a "1" logic level at its select input, in this example. Is connected to ground via resistor 47. The other input, which is selected in response to a "0" logic level at the select input of multiplexer 48, receives the state of bit CBIT in EEPROM 28. The output of multiplexer 48 is applied, via control line PROT, to logic circuitry (not shown) within input/output port 26 as a protocol configuration signal. Input/output port 26 realizes the selected protocol according to which its operation is to be carried out, in response to the logic level on control line PROT.

As mentioned above, this embodiment of the invention is particularly useful in connection with the electrical testing of integrated circuit 20 during or after its manufacture. For example, such testing may be performed in wafer form, or more typically after its packaging, prior to shipment to the eventual user. At the time of its testing, according to this embodiment of the invention, the manufacturer has not yet configured the configurable circuitry, which in this example is performed by programming bit CBIT in EEPROM 28 so as to configure input/output port 26 to operate according to the desired protocol. As such, at the time that the operation of integrated circuit 20 according to this invention is performed, the protocol according to which input/output 26 port will operate is unknown or indeterminate. The operation of integrated circuit 20 according to this embodiment of the invention, in enabling the external selection of a default configuration for configurable input/output port 26, will now be described in the context of testing during or after manufacture.

According to this embodiment of the invention, the operation of integrated circuit 20 is initiated by its powering-up from a powered-down state, or alternatively in response to a full hardware reset of the device. This initiation of the power-up or reset operation in the test context is performed while externally pulling up terminal AMUX to a high logic level, for example by way of pull-up resistor 49 within automatic test equipment ATE that is connected to terminal AMUX during this test operation, as shown in FIG. 3.

On power up, as noted above, AMUX control register 32 loads its power-on default value of $00000_2$, and forwards a corresponding digital value to the select input of multiplexer 30. Multiplexer 30 responds to that select value by way of its select input decoder 38 (FIG. 3) asserting an active high logic level on its output "[00000]=true", and de-asserting (low logic levels) on all of the rest of its outputs. This output from select input decoder 38 turns on pass gate $40_0$ and turns off all other pass gates $40_1$ through $40_{31}$ in multiplexer 30, connecting terminal AMUX to the positive input of comparator 44. As a result, in this initial time interval following power-up, the high logic level voltage connected to terminal AMUX by automatic test equipment ATE is forwarded by multiplexer 30 to the positive input of comparator 44 in comparator logic 35. At all times during which multiplexer 30 is selecting a different input for coupling to terminal AMUX (e.g., when the contents of AMUX control register 32 are something other than $00000_2$), pull-down resistor 42 passively pulls this positive input of comparator 44 to ground.

In this example, the high logic level to which terminal AMUX is pulled by automatic test equipment ATE is above the reference voltage (e.g., above bandgap reference voltage v_bg). As such, comparator 44 issues a high logic level on line def_sel that is forwarded to the select input of multiplexer 48 in input/output port 26. This logic level on line def_sel causes multiplexer 47 to select the input coupled to ground through resistor 47, thus forwarding a low logic level on line PROT to the remainder of input/output port 26. As discussed above, this logic level indicates the desired protocol according to which the operation of input/output port 26 is to operate, and blocks the state of bit CBIT in EEPROM 28 from, determining the choice of protocols. This is the desired result according to this embodiment of the invention, because bit CBIT in EEPROM 28 has not been set to either a "0" or "1" at this point in the test flow—indeed, the logic state of bit CBIT may in fact be indeterminate, or at some level near the logic threshold that would be unreliable in setting the default protocol.

Additionally, the signal level selected by multiplexer 48 and forwarded on line PROT, or generated by additional circuitry elsewhere within integrated circuit 20 in response to the operation of the circuitry described above relative to this embodiment of the invention, can be used to place integrated circuit 20 into a "test" mode. As known in the art, special test modes, in contrast to normal operating modes, can be used to exercise integrated circuits in special operating modes for test purposes, for example by way of the well-known "boundary scan" technique.

Now that input/output port 26 is reliably placed into its default configuration or state, integrated circuit 20 may be fully tested. Such testing can include full functional testing, including functional testing of input/output port 26 itself as configured into its default state defined by the logic level of the input applied to and selected by multiplexer 48, in this example.

Following the testing of integrated circuit 20 with input/output port 26 in its default state, integrated circuit 20 can then be configured to the desired state or protocol, as appropriate for the circuit function. In the example described above, this configuration is accomplished by programming or erasing the contents of bit CBIT in EEPROM 28; it is contemplated that this programming can be accomplished via input/output port 26 itself (operating in the default configuration or mode, as described above). Alternatively, configuration can be left to the ultimate user of integrated circuit 20, with confidence that the device is fully operational based on the full testing made available in connection with this invention. In any event, following configuration of input/output port 26 into the desired mode or protocol, integrated circuit 20 can then be operated in its normal operating modes. In such normal operating modes, multiplexer 30 can then be controlled to select a different input for coupling to external terminal AMUX, for example by writing the desired control value into AMUX control register 32. External terminal AMUX can then serve as an output terminal, presenting the current state of whatever internal node multiplexer 30 has coupled it to, in this normal operation; as mentioned above, it is also possible that terminal AMUX can be used as an input, for example to evaluate a trip point involved in the operation of functional circuitry 24. And because of the connection of resistor 42 to the input of comparator 44, upon power-up or at any other time in which AMUX control register 32 stores the default value of $00000_2$, comparator 44 will not affect the selection of the configuration state from EEPROM 28, unless terminal AMUX is actively driven to a high level, in the manner described above. It is therefore contemplated that the presence of the circuitry involved in realizing this embodiment of the invention will not deleteriously affect the normal operation of integrated circuit 20 in any way whatsoever.

According to this embodiment of the invention, therefore, a default state of configurable circuitry in an integrated circuit can be reliably defined, even at a point in time prior to configuration of configurable circuitry by the manufacturer or user of the integrated circuit. Whatever that defined default state or configuration may be, according to this invention, that state or configuration can be considered to be reliably known, which allows for thorough functional and parametric testing of the integrated circuit.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit, comprising:
    functional circuitry;
    configurable circuitry, coupled to the functional circuitry, and capable of operating according to a selected one of a plurality of modes;
    circuitry for storing configuration information, the storing circuitry coupled to the configurable circuitry and operable in a selected mode corresponding to the stored configuration information;
    a first external terminal coupled to the functional circuitry, for presenting an output signal during a normal operating mode of the integrated circuit; and
    circuitry for coupling the first external terminal to the configurable circuitry upon power-up of the integrated circuit so that, responsive to the first external terminal being at a selected logic level after power-up of the integrated circuit, the configurable circuitry operates according to a default mode of the plurality of modes,
    wherein the coupling circuitry comprises:
    a first multiplexer having a plurality of multiplexer inputs, a select input, and a multiplexer output coupled to the first external terminal;
    comparator logic, having a first comparator input coupled to a first multiplexer input, a second comparator input receiving a reference level, and a comparator output;
    control circuitry for causing the first multiplexer to couple the first multiplexer input to the multiplexer output upon power-up of the integrated circuit; and
    a second multiplexer, having a first input coupled receiving a level corresponding to selection of the default mode, a second input coupled to the storing circuitry, and a control input coupled to the comparator output, the second multiplexer connecting its output to the first input responsive to the comparator logic detecting that the external terminal is at the selected logic level.

2. The integrated circuit of claim 1, wherein the configurable circuitry comprises:
    an input/output port, coupled to at least a second external terminal.

3. The integrated circuit of claim 2, wherein the plurality of modes corresponds to a plurality of input/output port protocols.

4. The integrated circuit of claim 1, wherein the storing circuitry comprises a programmable non-volatile memory.

5. The integrated circuit of claim 1, further comprising:
    a resistor for pulling the first comparator input to a voltage opposite the selected logic level.

6. The integrated circuit of claim 1, wherein the storing circuitry comprises a programmable non-volatile memory.

7. The integrated circuit of claim 1, wherein the control circuitry comprises:
    a control register, having an output for presenting its contents to the select input of the first multiplexer;
    wherein the control register is arranged to load a value corresponding to selection of the first multiplexer input responsive to power-up of the integrated circuit.

8. A method of operating an integrated circuit in a default mode for configurable circuitry in the integrated circuit, comprising the steps of:
    powering-up the integrated circuit;
    responsive to the powering-up step, sensing an externally-applied level at a first external terminal of the integrated circuit;
    responsive to the sensing step determining that the first external terminal is at a selected logic level, controlling the configurable circuitry to operate in a default mode;
    then operating the integrated circuit in the default mode; and
    then operating the integrated circuit in a normal operating mode in which the first external terminal is an output of the integrated circuit,
    wherein the sensing step comprises:
    responsive to the powering-up step, coupling the first external terminal to an input of a comparator; and
    operating the comparator to compare the level at the first external terminal with a reference level, and to produce a comparator output signal responsive thereto.

9. The method of claim 8, wherein the step of operating the integrated circuit in the normal operating mode comprises:
    storing configuration information in the integrated circuit, the configuration information indicating a selected one of a plurality of available configurations, according to which the configurable circuitry is to operate; and
    communicating the configuration information to the configurable circuitry.

10. The method of claim 8, wherein the coupling step comprises:
    controlling a multiplexer to couple a first multiplexer input that is connected to the input of the comparator, to a multiplexer output that is connected to the first external terminal.

11. The method of claim 10, wherein the controlling step comprises:
    loading a default value into a register, the register having an output for communicating its contents to a select input of the multiplexer.

12. The method of claim 8, wherein the step of controlling the configurable circuitry to operate in a default mode comprises:
    coupling the comparator output to a select input of a multiplexer, the multiplexer having a first input coupled to a level corresponding to the default mode, having a second input coupled to circuitry storing the configuration information, and an output coupled to the configurable circuitry, so that responsive to the comparator output indicating that the first external terminal is at a level indicating operation in the default mode, the multiplexer couples its first input to its output.

13. The method of claim 8, further comprising:
after the step of operating the integrated circuit in the default mode, configuring the configurable circuitry.

14. The method of claim 13, wherein the configuring step comprises:
programming one or more memory bits in a non-volatile memory.

15. The method of claim 13, wherein the step of operating the integrated circuit in the default mode comprises:
operating a configurable input/output port according to a default protocol.

16. The method of claim 15, wherein the configuring step comprises:
selecting an input/output protocol; and
programming one or more memory bits in a non-volatile memory with a data state corresponding to the selected input/output protocol.

* * * * *